US009020088B2

(12) United States Patent
Zhodzishsky et al.

(10) Patent No.: US 9,020,088 B2
(45) Date of Patent: Apr. 28, 2015

(54) DIGITAL SYSTEM AND METHOD OF ESTIMATING QUASI-HARMONIC SIGNAL NON-ENERGY PARAMETERS USING A DIGITAL PHASE LOCKED LOOP

(75) Inventors: Mark I. Zhodzishsky, Moscow (RU);
Victor A. Prasolov, Moscow (RU);
Alexey S. Lebedinsky, Moscow (RU);
Daniel S. Milyutin, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 202 days.

(21) Appl. No.: 13/992,288

(22) PCT Filed: Sep. 12, 2012

(86) PCT No.: PCT/RU2012/000750
§ 371 (c)(1),
(2), (4) Date: Jun. 7, 2013

(87) PCT Pub. No.: WO2014/042546
PCT Pub. Date: Mar. 20, 2014

(65) Prior Publication Data
US 2014/0072084 A1 Mar. 13, 2014

(51) Int. Cl.
*H03D 3/24* (2006.01)
*H04L 7/033* (2006.01)
*G01S 19/29* (2010.01)
*H03L 7/085* (2006.01)

(52) U.S. Cl.
CPC .............. *H04L 7/0331* (2013.01); *G01S 19/29* (2013.01); *H03L 7/085* (2013.01); *H03L 2207/50* (2013.01)

(58) Field of Classification Search
CPC ..... H04B 17/00; H03L 7/085; H03L 2207/50; H03L 7/08; H03L 7/1976; H03L 7/087; H03L 7/091; G01S 19/29; H04L 7/0331
See application file for complete search history.

(56) References Cited

U.S. PATENT DOCUMENTS

| 6,650,187 B1 * | 11/2003 | Riddle et al. ..................... 331/17 |
| 7,222,035 B1 * | 5/2007 | Zhodzishsky et al. .......... 702/75 |
| 7,495,607 B1 * | 2/2009 | Zhodzishsky et al. ... 342/357.31 |
| 8,502,582 B2 * | 8/2013 | August et al. ................. 327/159 |
| 2005/0001661 A1 * | 1/2005 | Regev ........................... 327/156 |
| 2005/0258908 A1 * | 11/2005 | Mitric ............................. 331/16 |
| 2010/0123492 A1 * | 5/2010 | Atsumi ......................... 327/156 |
| 2011/0050998 A1 * | 3/2011 | Gao et al. ...................... 348/536 |

* cited by examiner

*Primary Examiner* — Daniel Washburn
*Assistant Examiner* — Amneet Singh
(74) *Attorney, Agent, or Firm* — Bardmesser Law Group

(57) ABSTRACT

The present invention proposes a digital system and method of measuring (estimating) non-energy parameters of the signal (phase, frequency and frequency rate) received in additive mixture with Gaussian noise. The first embodiment of the measuring system consists of a PLL system tracking variable signal frequency, a block of NCO full phase computation (OFPC), a block of signal phase primary estimation (SPPE) and a first type adaptive filter filtering the signal from the output of SPPE. The second embodiment of the invention has no block SPPE, and NCO full phase is fed to the input of a second type adaptive filter. The present invention can be used in receivers of various navigation systems, such as GPS, GLONASS and GALILEO, which provide precise measurements of signal phase at different rates of frequency change, as well as systems using digital PLLs for speed measurements.

19 Claims, 7 Drawing Sheets

DIGITAL SYSTEM AND METHOD OF ESTIMATING QUASI-HARMONIC SIGNAL NON-ENERGY PARAMETERS USING A DIGITAL PHASE LOCKED LOOP

CROSS REFERENCE TO RELATED APPLICATIONS

This application is a US National Phase of PCT/RU2012/000750, filed on 12 Sep. 2012, incorporated herein by reference in its entirety.

BACKGROUND OF THE INVENTION

Phase, frequency and frequency rate are parameters independent of energy of the input signal (i.e., non-energy parameters). There are known methods of estimating signal non-energy parameters based on processing of variables received from a phase-lock loop (PLL).

A method and apparatus are used for estimating changing frequency of a signal received by a satellite receiver, see U.S. Pat. No. 7,222,035. The system includes a PLL having a numerically controlled oscillator (NCO) and a filter of frequency estimates (FFE). The PLL tracks the changing signal frequency and outputs non-smoothed frequency estimates into the FFE. The FFE then smoothes noise in the signal to produce a more accurate smoothed frequency estimate of the input signal.

A system according to K. Sithamparanathan, *Digital-PLL Assisted Frequency Estimation with Improved Error Variance*, Create-Net Int. Res. Centre, Trento, IEEE Globecom, Nov. 30, 2008-Dec. 4, 2008, includes a PLL having NCO and a moving average filter (MAF) having N-samples length. The frequency estimates are produced by MAF using the frequency information contained in the phase error process of the digital PLL. The precision of frequency estimation by this method is proportional to 1/N.

The apparatus and methods described in U.S. Pat. No. 7,869,554 use a PLL and provide a phase estimation of the input signal from which signal frequency is estimated by a derivative function and low pass filtering.

A DPLL described in U.S. Pat. No. 4,771,250 generates signal phase which is an approximation of the phase of a received signal with a linear estimator. The effect of a complication associated with non-zero transport delays related to the DPLL is then compensated by a predictor. The estimator provides recursive estimates of phase, frequency, and higher order derivatives, while the predictor compensates for transport lag inherent in the loop.

K. De Brabandere et al., *Design and Operation of a Phase-Locked Loop with Kalman Estimator-Based Filter for Single-Phase Applications*, IEEE 2006, http:**www.esat.kuleuven.be/electa/publications/fulltexts/pub_1620.pdf describes the design procedure of a Phase-Locked Loop (PLL) preceded by a Kalman estimator-based filter. It provides a highly accurate and fast estimate of the 50 Hz electrical grid frequency and phase angle in grid-connected power electronic applications. A Kalman filter is placed before the PLL in order to ensure that the PLL input matches an ideal sinusoidal waveform as closely as possible at all times, even when the voltage is highly distorted by the presence of harmonics. This ensures fast and low-distortion operation of the PLL for single-phase applications.

A method of measuring frequency for sinusoidal signals according to US Patent Publication No. 2011/0050998, published Aug. 31, 2009, entitled *Digital Phase Lock Loop Configurable As A Frequency Estimator*, provides for obtaining a current signal phase as an argument of a complex number, the in-phase samples being a real part of the number, while the quadrature samples of quadrature signal decomposition components, converted into digital form and filtered, being an imaginary part of the number; receiving and storing a data block from sequential current differences in signal phases; generating a weight function in accordance with the given mathematical equations, which are used to estimate signal frequency.

However, the above methods do not provide optimal frequency measurements when frequency is unstable.

Unlike the methods above, the present invention enables obtaining optimal phase estimates of the input signal and its derivatives at the outputs of a first-type filter or a second-type filter with the help of DPLL variables which are further used to compute NCO full phase and primary phase estimates of the input signal.

SUMMARY OF THE INVENTION

Accordingly, the present invention is related to a method and system for a system and method of estimating quasi-harmonic signal non-energy parameters using a digital Phase Locked Loop that substantially obviates one or more of the disadvantages of the related art.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
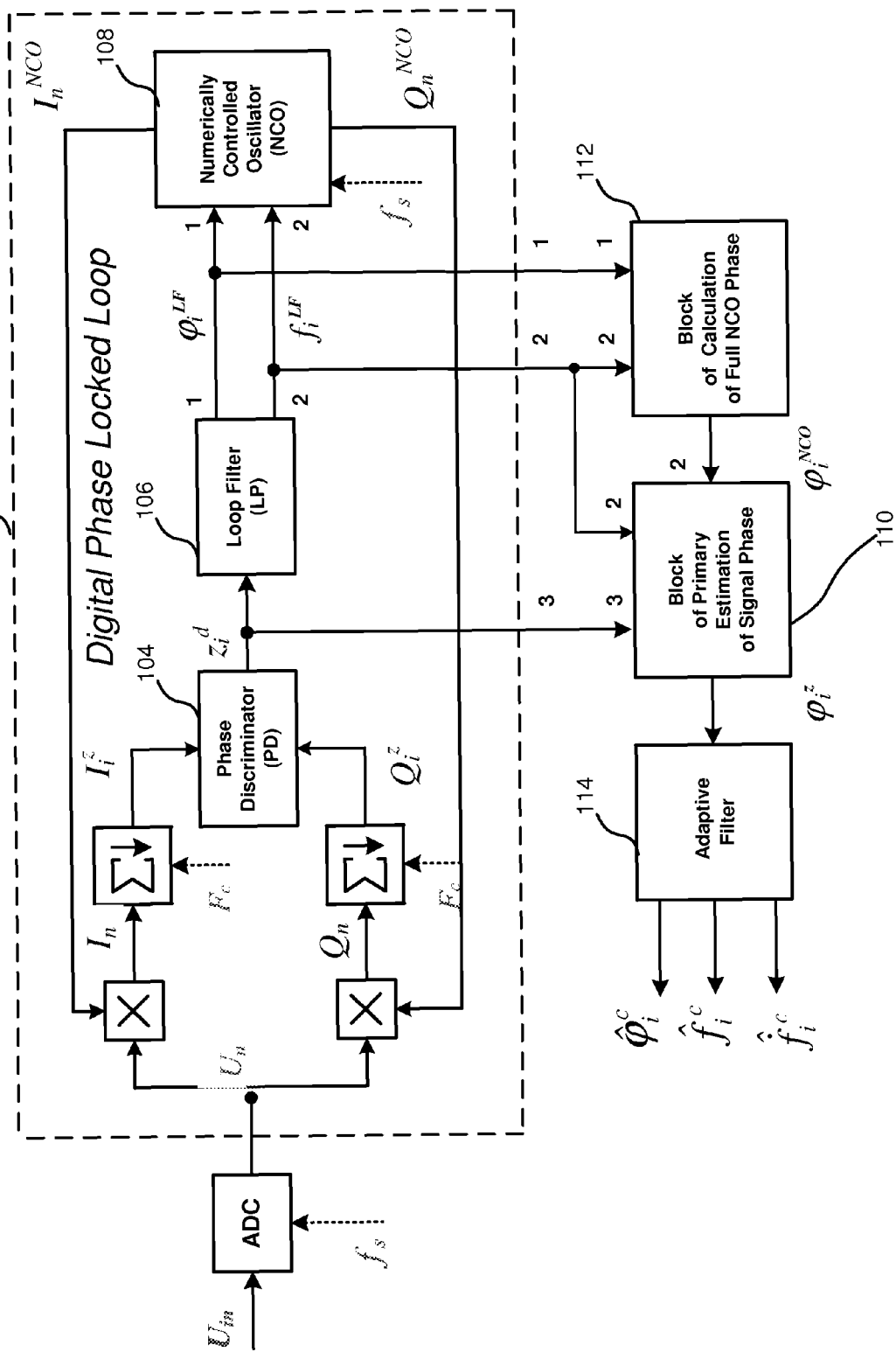
FIG. 1 is a block diagram for a first embodiment of the invention.

FIG. 1 shows a block-diagram of the first embodiment of the invention.

The measuring system is based on filtering primary estimates of signal phase which are obtained with a digital PLL system. The measuring system includes a computational block (112) to calculate full phases of NCO, a block of signal phase primary estimation (SPPE, block 110), and an adaptive filter (114) of the first embodiment of the invention filtering signal from the output of block 110. FIG. 1 presents a conventional digital PLL system 102 consisting of the following main units: digital phase discriminator (PD) 104, digital loop filter (LF) 106, and digital numerically-controlled oscillator (NCO) 108.

An input analog process $U_a(t)=U_c(t)+U_n(t)$ representing an additive mixture of quasi-harmonic signal $U_c(t)$ and Gaussian noise $U_n(t)$ is converted into a digital form at sampling frequency/rate $f_s$ with the help of analog-to-digital convertor (ADC). Desired signal $U_c(t)$ is equal to $$U_c(t)=A_c \cos[2\pi\phi_c(t)]. \qquad (1)$$

where $A_c$ is the amplitude of the signal, $\phi_c(t)=\int f_c(t)dt+\phi_0$ is the signal phase [cycles], $f_c(t)$ is the signal frequency [Hz], $\phi_0$ is the initial phase [in cycles].

Signal phase $\phi_c(t)$, signal frequency $f_c(t)$ and frequency rate $\dot{f}_c(t)$ should be estimated (measured). Samples of the input process from the ADC output $U_d(n/f_s)$ are multiplied by quadrature digital samples from NCO $$\begin{aligned} I_n^{NCO} &= A_{NCO}\cos(2\pi\varphi_n^{NCO}) \\ Q_n^{NCO} &= A_{NCO}\sin(2\pi\varphi_n^{NCO}) \end{aligned} \qquad (2)$$

where $A_{NCO}$ is the sample amplitude, and $\phi_n^{NCO}$ is NCO phase in cycles. Multiplication results $$\begin{aligned} I_n &= U_d(n/f_s) \cdot A_{NCO}\cos(2\pi\varphi_n^{NCO}) \\ Q_n &= U_d(n/f_s) \cdot A_{NCO}\cos(2\pi\varphi_n^{NCO}) \end{aligned} \qquad (3)$$

are fed to the input of lower frequency digital filters, which are typically reset accumulators $\Sigma\downarrow$ with frequency $F_c \ll f_s$ (FIG. 1). The reset frequency of accumulators $F_c$ is the control frequency in the PLL, for example, $F_c$=50 Hz . . . 1000 Hz; $f_s$=10 MHz . . . 100 MHz. At the output of the accumulators with frequency $F_c$, the generated samples are $$I_i^\Sigma = \sum_{m=1}^{m=N_s} I_{m+(i-1)\cdot N_s} \qquad (4)$$

and $$Q_i^\Sigma = \sum_{m=1}^{m=N_s} Q_{m+(i-1)\cdot N_s},$$

which are fed to the inputs of the arctangent phase discriminator producing signal $z_i^d$:

$$z_i^d = \frac{1}{2\pi} \cdot arctg(Q_i^\Sigma / I_i^\Sigma)_{[cycles]} \qquad (5)$$

Figure 2:
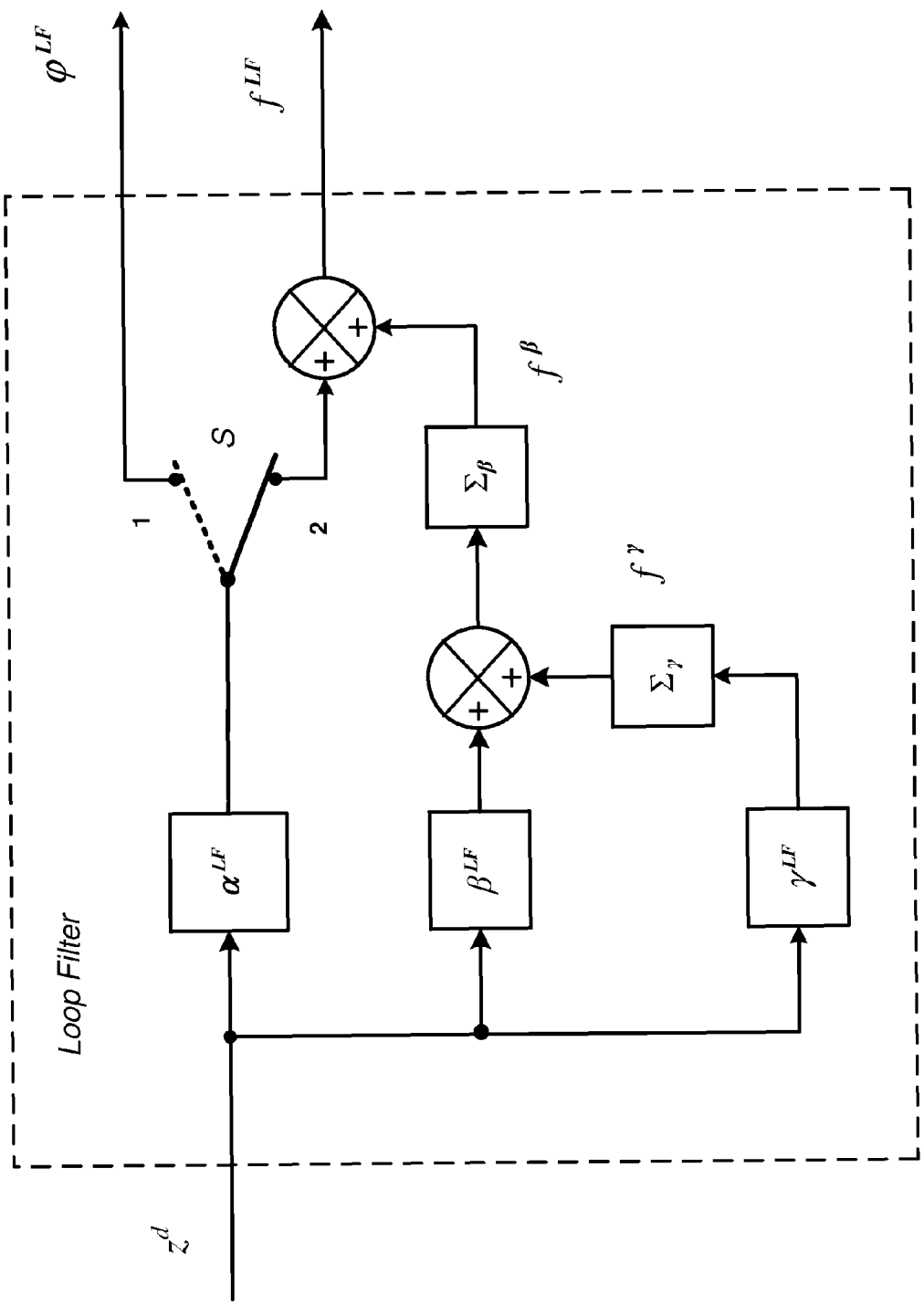
FIG. 2 is a functional schematic for loop filter of a third order DPLL.

Further, signal $z_i^d$ from the PD output comes to the input of the proportionally-integrating loop filter (LF) which in the third order PLL includes three inertia-free members with constant transfer gains $\alpha^{LF}, \beta^{LF}, \gamma^{LF}$, two accumulators $\Sigma_\beta, \Sigma_\gamma$ and two adders (FIG. 2).

Recurrent equations of the loop filter are:

a) with a frequency controlled NCO (switch S in position 1 in FIG. 2)

$$\left.\begin{aligned} \varphi_i^{LF} &= 0 \\ f_i^\gamma &= f_{i-1}^\gamma + \gamma^{LF} \cdot z_i^d \\ f_i^\beta &= f_{i-1}^\beta + f_i^\gamma + \beta^{LF} \cdot z_i^d \\ f_i^{LF} &= f_i^\beta + \alpha^{LF} \cdot z_i^d \end{aligned}\right\}; \qquad (6)$$

b) with frequency-phase controlled NCO (NCO with frequency and phase control) (switch S in position 2 in FIG. 2)

$$\left.\begin{aligned} \varphi_i^{LF} &= \alpha^{LF} \cdot z_i^d \\ f_i^\gamma &= f_{i-1}^\gamma + \gamma^{LF} \cdot z_i^d \\ f_i^\beta &= f_{i-1}^\beta + f_i^\gamma + \beta^{LF} \cdot z_i^d \\ f_i^{LF} &= f_i^\beta \end{aligned}\right\}. \qquad (7)$$

Digital phase samples $\phi_i^{LF}$ are fed to the NCO phase control input and abruptly change its phase by the corresponding value $\Delta\phi_i^{NCO}=\phi_i^{LF}\cdot\Delta_\phi^{NCO}$, where $\Delta_\phi^{NCO}$ is the phase step size in the NCO. Samples $f_i^{LF}$ (frequency codes) are delivered to the NCO frequency input and determine its frequency $f_i^{NCO}=f_i^{LF}\cdot\Delta_f^{NCO}$, where $\Delta_f^{NCO}$ is the frequency step size in the NCO. Since NCO frequency is constant over the entire interval $T_c$, NCO phase changes linearly on intervals $T_c$.

Figure 3:
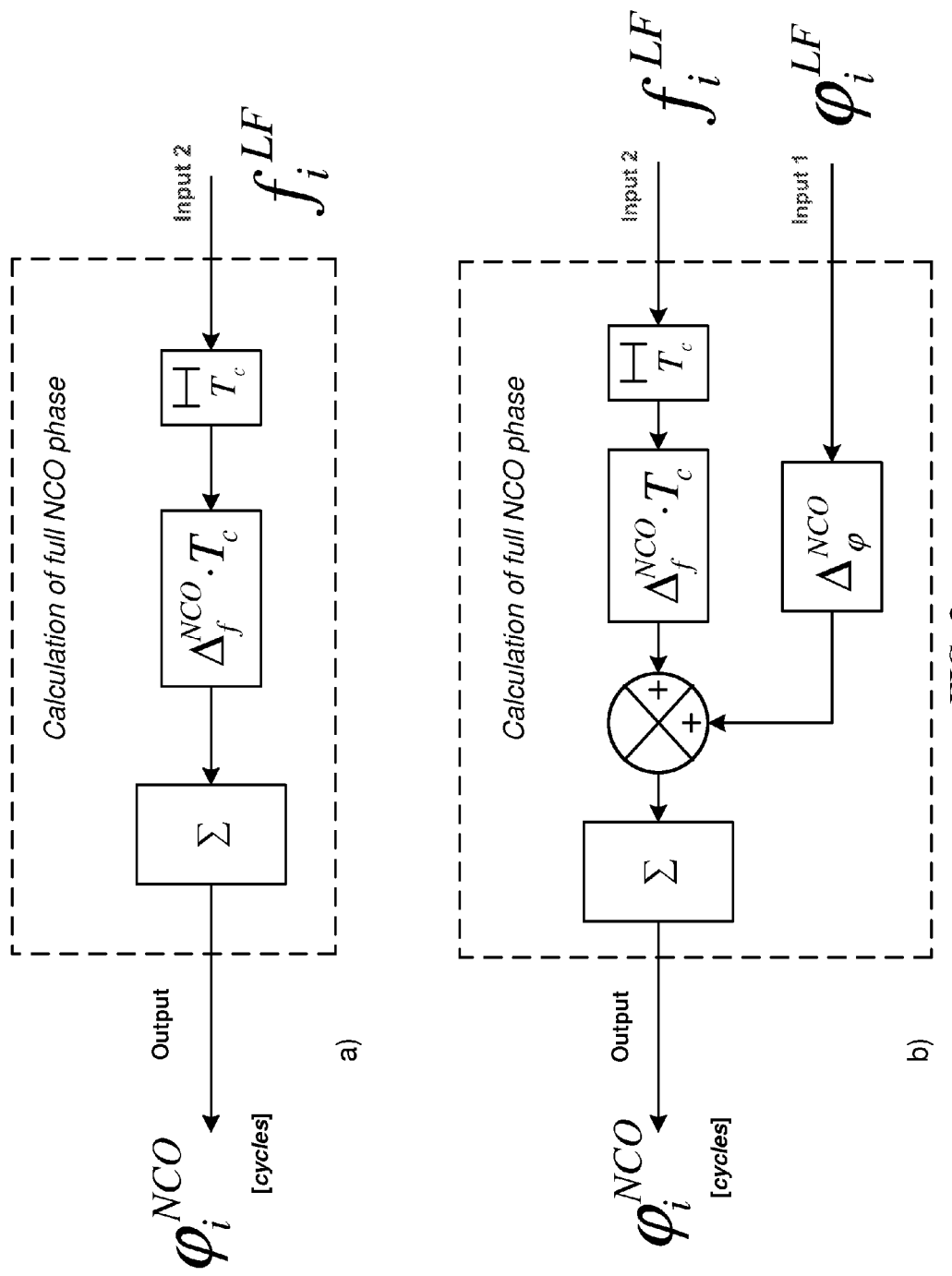
FIG. 3 is a functional schematic for a block of NCO full phase estimation (OFPC) if NCO has only a frequency control; and if NCO has both frequency and phase control.
Figure 4:
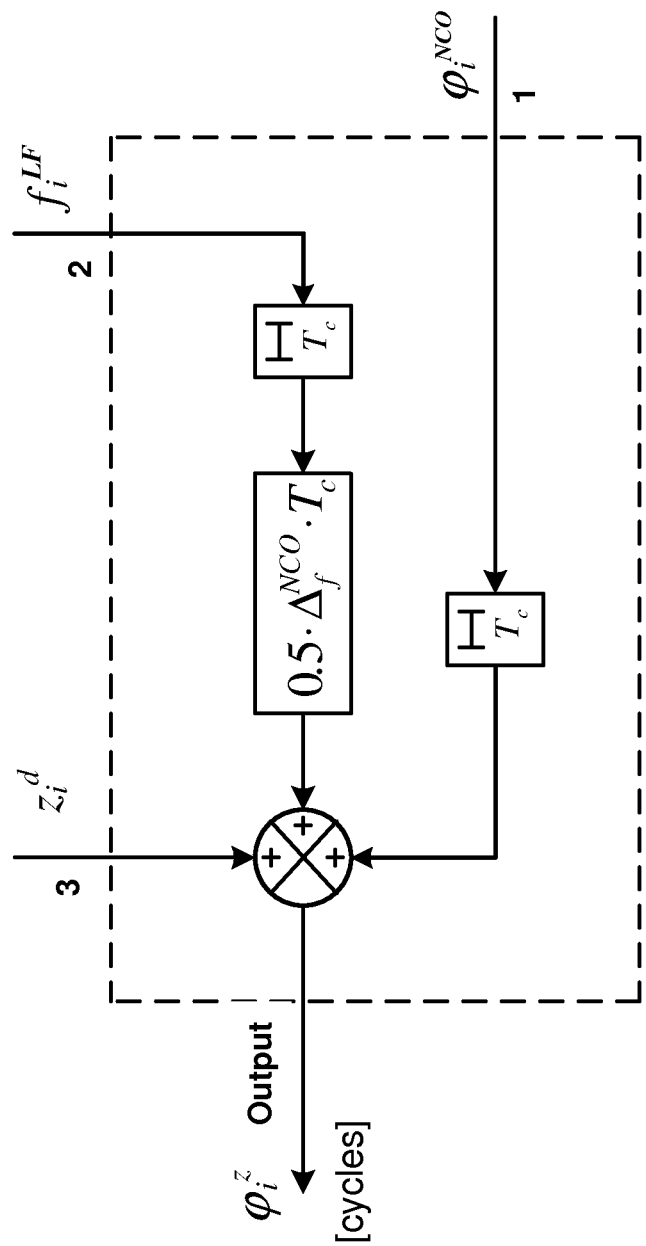
FIG. 4 is a functional schematic for the block of signal phase primary estimation (SPPE).

FIG. 3 shows a functional block-diagram to calculate full phase of NCO. The operation of the block is described by the following recurrent equations:

a) for the case of frequency-controlled NCO (switch S in position 1 in FIG. 2)

$$\phi_i^{NCO}=\phi_{i-1}^{NCO}+f_{i-1}^{LF}\cdot\Delta_f^{NCO}\cdot T_c \text{ [cycles]}. \qquad (8)$$

b) for the case of frequency-phase-controlled NCO (switch S in position 2 in FIG. 2)

$$\phi_i^{NCO}=\phi_{i-1}^{NCO}+\phi_i^{LF}\cdot\Delta_\phi^{NCO}+f_{i-1}^{LF}\cdot\Delta_f^{NCO}\cdot T_c \text{ [cycles]}. \qquad (9)$$

A block of primary estimates of input signal phase operates in accordance with the following recurrent equation:

$$\phi_i^z=z_i^d+\phi_{i-1}^{NCO}+0.5\cdot f_{i-1}^{LF}\cdot\Delta_f^{NCO}\cdot T_c. \qquad (10)$$

The primary estimates of input signal phase (equation 10) are formed as the sum of three factors: $z_i^d$ which is the output of the phase discriminator at a discrete time moment i (see equation (5)); $\phi_{i-1}^{NCO}$ which is the full phase of the filter, calculated at the previous discrete time moment i−1; and ½ of the product of three elements—the frequency output $f_{i-1}^{LF}$ of the loop filter at the previous moment i−1, a discrete frequency step size $\Delta_f^{NCO}$ of the NCO [Hz] and the time period $T_c$ of the PLL.

Figure 5:
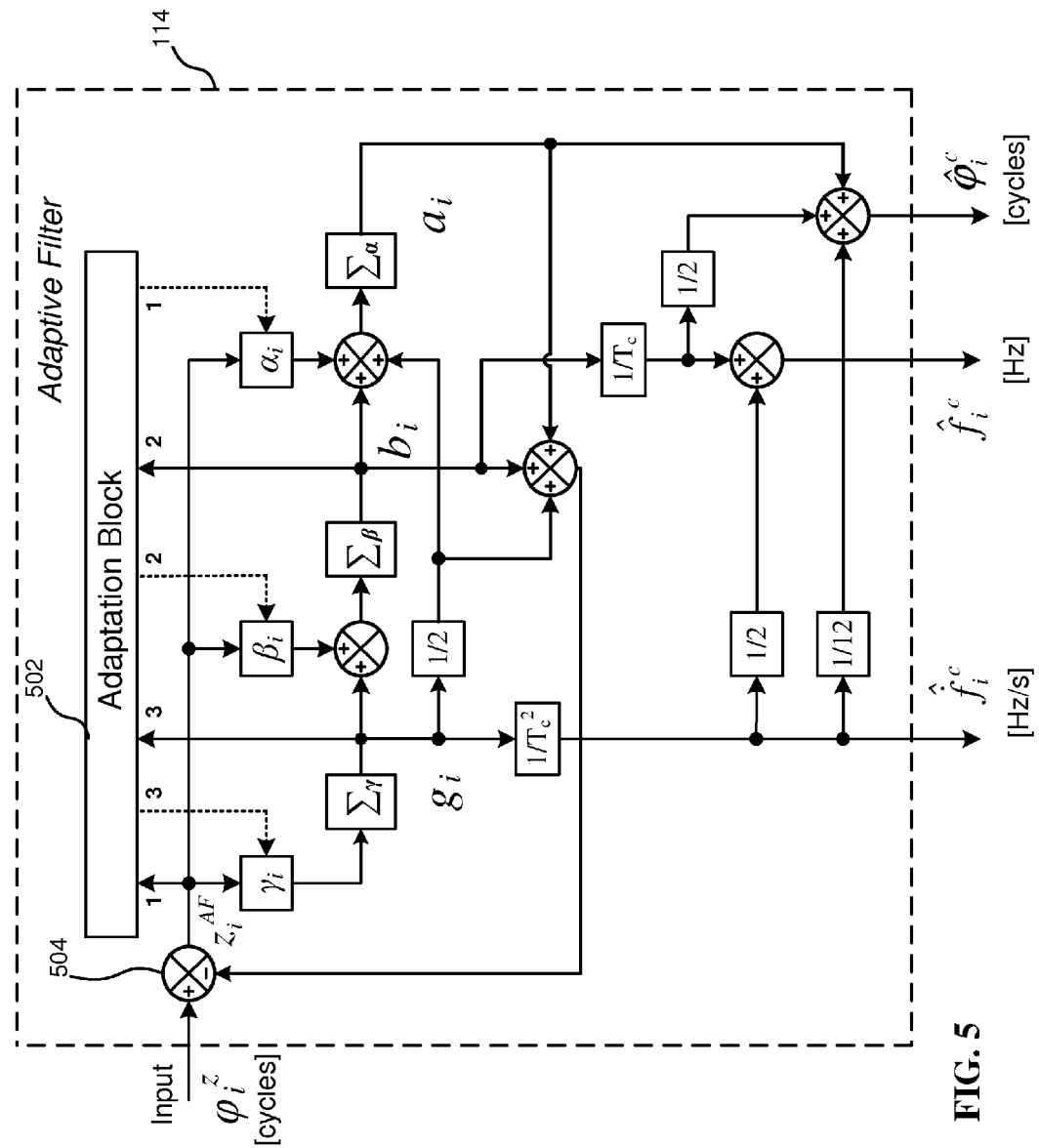
FIG. 5 is a functional schematic for the adaptive filter (AF) of a first embodiment of the invention.

Samples $\phi_i^z$ are fed to the input of the adaptive filter with variable transfer gains generated by an adaptation block (FIG. 5).

A third-order adaptive filter functions according to the recurrent equations:

a variable at the output of the subtracting unit (504 in FIG. 5) is equal to $$z_i^{AF} = \phi_i^z - (a_{i-1} + b_{i-1} + 0.5 \cdot g_{i-1}); \qquad (11)$$

where auxiliary variables $a_i$, $b_i$ and $g_i$ are $$\left.\begin{aligned} a_i &= a_{i-1} + b_{i-1} + 0.5 \cdot g_{i-1} + \alpha_i \cdot z_i^{AF} \\ b_i &= b_{i-1} + g_{i-1} + \beta_i \cdot z_i^{AF} \\ g_i &= g_{i-1} + \gamma_i \cdot z_i^{AF} \end{aligned}\right\}; \qquad (12)$$

where $\alpha_i$, $\beta_i$ and $\gamma_i$ are the transfer coefficients defined by the adaptation block (502); hence the estimated parameters are $$\left.\begin{aligned} \hat{\varphi}_i^c &= a_i + b_i/2 + g_i/12 \\ \hat{f}_i^c &= (b_i + g_i/2)/T_c \\ \hat{\dot{f}}_i^c &= g_i/T_C^2 \end{aligned}\right\}, \qquad (13)$$

where $\hat{\varphi}_i^c$ is the estimate of phase of the input signal,
$\hat{f}_i^c$ the estimate of frequency of the input signal,
$\hat{\dot{f}}_i^c$ is the estimate of changing rate of frequency of the input signal.

At $\gamma_i = 0$ the order of the filter will be second, and if $\beta_i = 0$ as well, AF will be a first-order filter.

At the beginning of operation the order of the adaptive filter is set considering a priori information about a movement pattern.

By analyzing $z_i^{AF}$ in the adaptive filter at the output of the subtracting unit and estimated parameters the adaptation block controls bandwidth and the order of the adaptive filter by changing transfer coefficients.

The adaptation block changes the bandwidth of the adaptive filter by varying auxiliary variable $k_i$ ($k_{min} \le k_i \le k_{max}$) that is used for calculation of AF transfer coefficients based on the following equations:

in a first-order adaptive filter $k_{min} = 1$ $$\alpha_i = 1/(k_i + 1), \qquad (14)$$

in a second-order adaptive filter $k_{min} = 2$ $$\left.\begin{aligned} \alpha_i &= \frac{6}{(k_i + 1)} - \frac{2}{k_i} \\ \beta_i &= \frac{6}{k_i(k_i + 1)} \end{aligned}\right\}, \qquad (15)$$

in a third-order adaptive filter $k_{min} = 3$ $$\left.\begin{aligned} \alpha_i &= (9 \cdot k_i^2 - 9 \cdot k_i + 6)/D \\ \beta_i &= (36 \cdot k_i - 18)/D \\ \gamma_i &= 60/D \end{aligned}\right\}; \qquad (16)$$

where $$D = k_i^3 + 3 \cdot k_i^2 + 2 \cdot k_i. \qquad (17)$$

From equations (14)-(17) it follows that as variable $k_i$ increases, AF transfer coefficients decreases, and hence the bandwidth reduces as well. And otherwise, as variable $k_i$ decreases, AF bandwidth increases. In order to minimize the transition process the adaptation block starts to operate at value $k_1 = k_s$, at which the adaptive filter bandwidth is approximately equal to the PLL bandwidth.

If $|z_i^{AF}|$ at the output of the subtracting unit does not exceed the preset threshold $z_{thr}^{AF} > 0$, the adaptation block reduces AF bandwidth by increasing variable $k_i$ by $\Delta_k$, and thereby reducing fluctuation errors of estimates for the signal parameters, i.e.:

if $|z_i^{AF}| \le z_{thr}^{AF}$, then $k_i = k_{i-1} + \Delta_k$, where $\Delta_k > 0$; (18)

if the obtained value $k_i > k_{max}$, then $k_i = k_{max}$; (19)

The threshold $z_{thr}^{AF}$ is selected based on compromise considerations: too high a threshold means the adaptation process will be long, and will have errors in the estimate during rapid changes in the input, while too low a value will lead to a worse estimate during operation that is close to steady state.

If value $|z_i^{AF}|$ at the output of the subtracting unit exceeds the preset threshold $z_{thr}^{AF}$, and the order of the adaptive filter $N^{AF}$ is less than maximum preset value $N^{AF}_{MAX}$, the adaptation block increases by 1 the order of the adaptive filter to reduce dynamic errors. The order of the adaptive filter is usually chosen as $N^{AF} \le 4$. If value $|z_i^{AF}|$ at the output of the subtracting unit exceeds the preset threshold $z_{thr}^{AF}$, and the order of the adaptive filter $N^{AF}$ is equal to the maximum preset value $N^{AF}_{MAX}$, the adaptation block increases AF bandwidth to reduce dynamic errors, i.e.

if $|z_i^{AF}| > z_{thr}^{AF}$, then $k_i = k_{i-1}/r$, where $r > 1$; (20)

if the obtained value $k_i < k_{min}$, then $k_i = k_{min}$. (21)

The higher the r, the higher the bandwidth of the adaptive filter during sharp changes in input. However, too high a value of r will lead to reduced accuracy. Typical values are $1 < r < 4$).

Further, obtained value $k_i$ is used to calculate AF transfer coefficients according to the equations (14)-(17) corresponding to the filter order.

Figure 6:
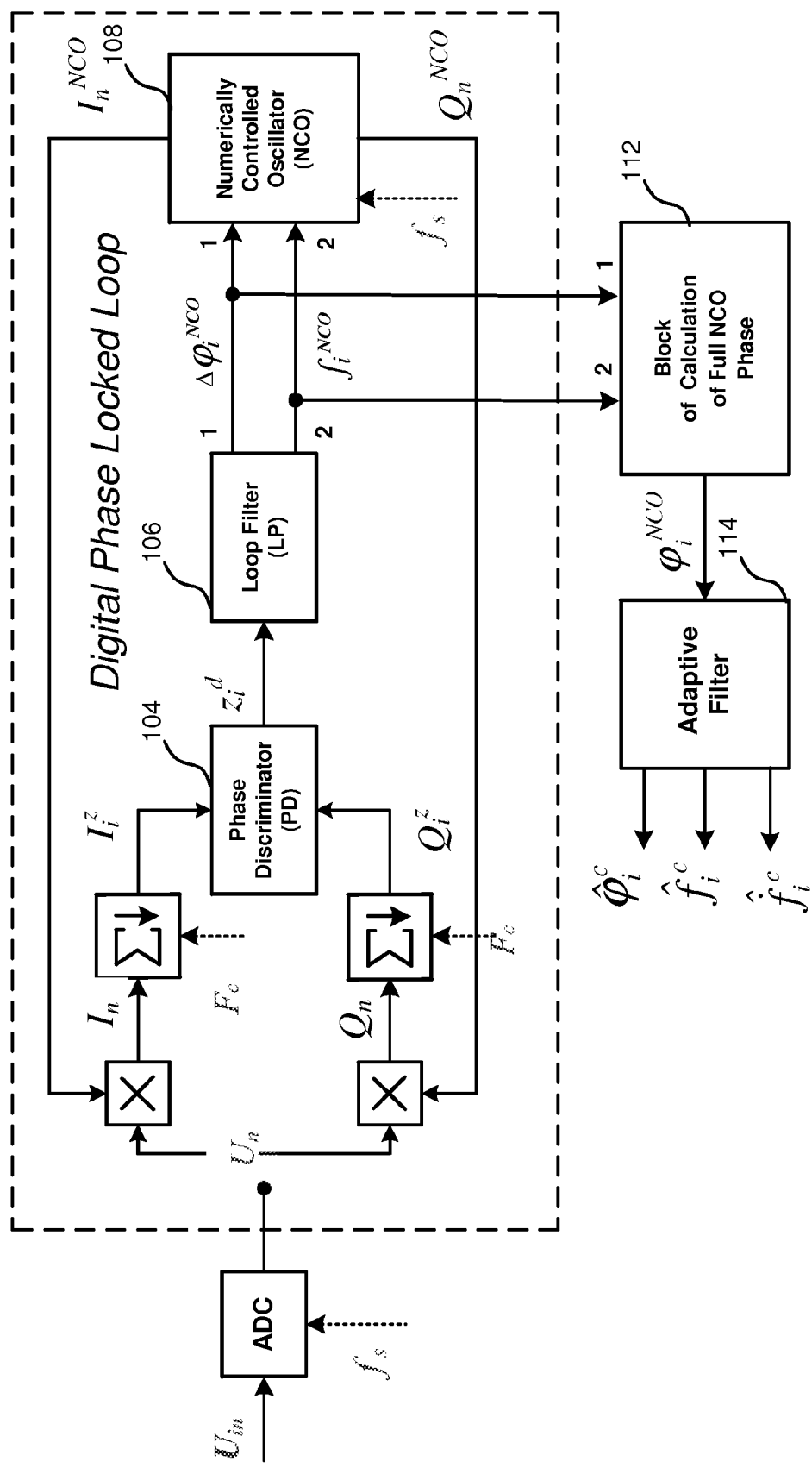
FIG. 6 is a block-diagram for a second embodiment of the invention.
Figure 7:
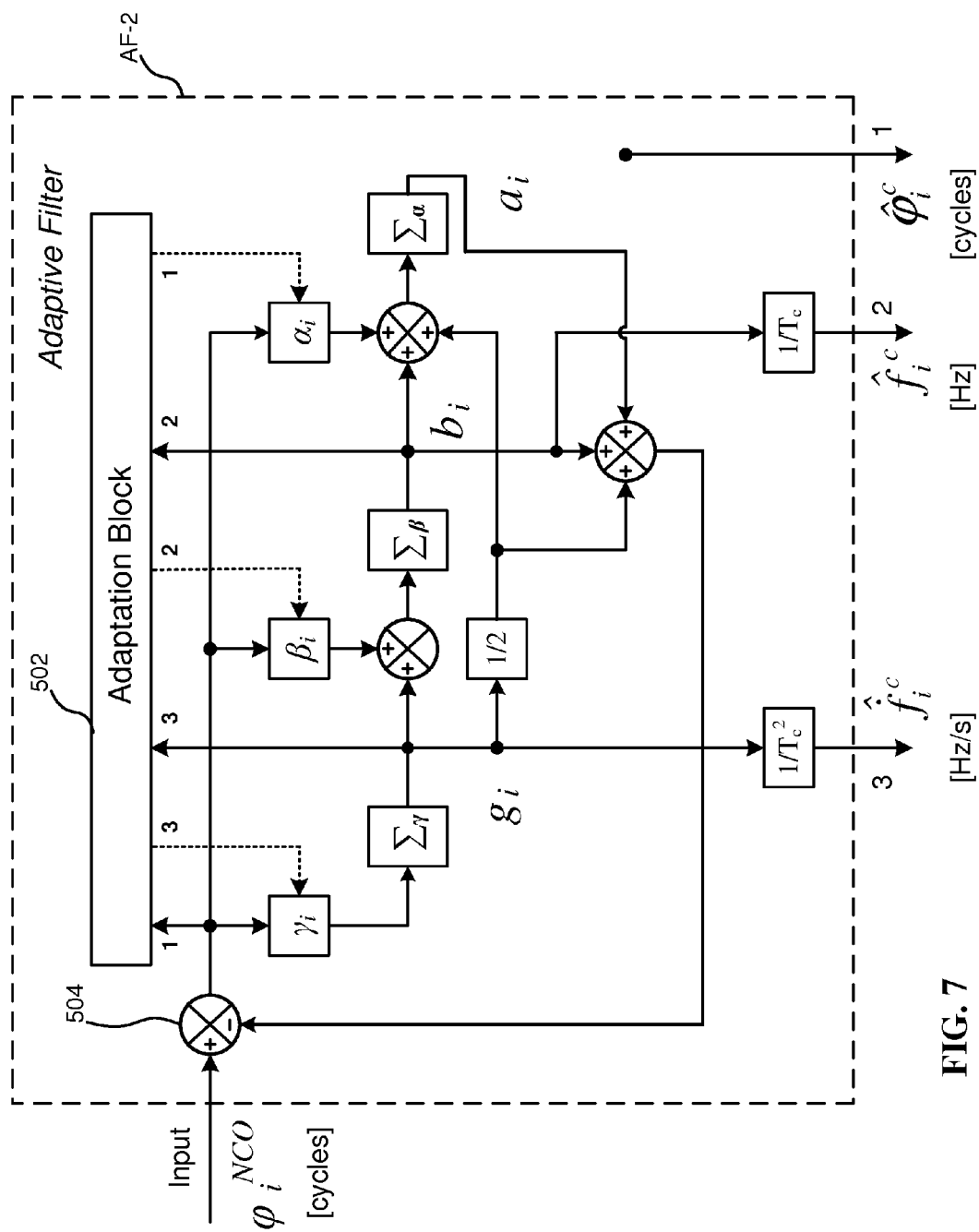
FIG. 7 is a functional schematic for the adaptive filter (AF) of the second embodiment of the invention.

FIG. 6 shows a block-diagram of the second embodiment of the invention. It differs from the first embodiment by absence of the block of primary estimates for signal phase, and by using a second-type adaptive filter instead of a first-type adaptive filter (FIG. 6). Full NCO phase is fed to the input of the adaptive filter AF-2 (FIG. 7) of the second embodiment of the invention, and a variable at the output of the subtracting unit is equal to $$z_i^{AF} = \phi_i^{NCO} - (a_{i-1} + b_{i-1} + 0.5 \cdot g_{i-1}). \qquad (22)$$

Auxiliary variables $a_i$, $b_i$ and $g_i$ in the adaptive filter AF of the second embodiment of the invention are calculated based on the same recurrent equations (12), the same as in AF of the first embodiment of the invention. Signal phase estimate $\hat{\varphi}_i^c$, signal frequency estimate $\hat{f}_i^c$ and the estimate of frequency rate $\hat{\dot{f}}_i^c$ for the second embodiment of the measuring system are presented by equations:

$$\left.\begin{aligned} \hat{\varphi}_i^c &= a_i \\ \hat{f}_i^c &= b_i/T_c \\ \hat{\dot{f}}_i^c &= g_i/T_C^2 \end{aligned}\right\}, \qquad (23)$$

Comparison of (13) and (28) shows that signal phase estimates $\hat{\varphi}_i^c$, signal frequency estimates $\hat{f}_i^c$ for the second embodiment of the measuring system with a third-order AF should be computed in accordance with different equations. The closed loops of the filters of the first and second embodiments of the invention work in a similar manner, the difference is in equations (13) and (23), where the loop variables $a_i$, $b_i$ and $g_i$ are used to form signal parameters $\hat{\phi}_i^c$, $\hat{f}_i^c$ and $\hat{\dot{f}}_i^c$.

Having thus described a preferred embodiment, it should be apparent to those skilled in the art that certain advantages of the described method and apparatus have been achieved.

It should also be appreciated that various modifications, adaptations, and alternative embodiments thereof may be made within the scope and spirit of the present invention. The invention is further defined by the following claims.

What is claimed is:

1. A system for estimating non-energy parameters of an input signal, the system comprising:
   a digital phase locked loop (PLL) that tracks the input signal and includes a phase discriminator, a digital loop filter and a digital numerically controlled oscillator (NCO);
   a NCO full phase calculating block receiving an input from the digital loop filter, and outputting a signal corresponding to a full phase of the NCO;
   a signal phase primary estimation (SPPE) block coupled to an output signal of the phase discriminator output, to a frequency output of the digital loop filter and to the output of the NCO full phase calculating block; and
   an adaptive filter containing an adaptation block filters a signal from the SPPE block and estimates any of phase, frequency, changing rate of frequency, and higher derivatives of the phase of the input signal as the non-energy parameters.

2. The system of claim 1, wherein the NCO full phase calculating block receives digital frequency samples $f_i^{LF}$ from an output of the digital loop filter of the PLL, and the NCO is frequency-controlled, and wherein the NCO full phase calculating block operates based on equation:

$$\phi_i^{NCO} = \phi_{i-1}^{NCO} + f_{i-1}^{LF} \cdot \Delta_f^{NCO} \cdot T_c \text{ [cycles]},$$

where $\Delta_f^{NCO}$ is a frequency step size in the NCO, and $T_c$ is a control period.

3. The system of claim 1, wherein the NCO full phase calculating block receives digital samples of frequency $f_i^{LF}$ and phase $\phi_i^{LF}$ from an output of the digital loop filter of the PLL, and the NCO is phase-controlled and frequency-controlled, and wherein the NCO full phase calculating block operates based on equation:

$$\phi_i^{NCO} = \phi_{i-1}^{NCO} + \phi_i^{LF} \cdot \Delta_\phi^{NCO} + f_{i-1}^{LF} \cdot \Delta_f^{NCO} \cdot T_c \text{[cycles]},$$

where $\Delta_\phi^{NCO}$ is a phase step size in the NCO.

4. The system of claim 1, wherein the SPPE block operates based on equation:

$$\phi_i^z = z_i^d + \phi_{i-1}^{NCO} + 0.5 \cdot f_{i-1}^{LF} \cdot \Delta_f^{NCO} \cdot T_c \text{[cycles]}.$$

5. The system of claim 1, wherein the adaptive filter has the third order (N=3) and is described by the following equations:

$$z_i^{AF} = \phi_i^z - (a_{i-1} + b_{i-1} + 0.5 \cdot T_c \cdot g_{i-1})$$

$$a_i = a_{i-1} + b_{i-1} + 0.5 \cdot g_{i-1} + \alpha_i z_i^{AF},$$

$$b_i = b_{i-1} + g_{i-1} + \beta_i z_i^{AF},$$

$$g_i = g_{i-1} + \gamma_i z_i^{AF},$$

$$\hat{\phi}_i^c = a_i + b_i/(2 \cdot T_c) + g_i/(12 \cdot T_c^2)$$

$$\hat{f}_i^c = b_i/T_c + g_i/(2 \cdot T_c^2),$$

$$\hat{\dot{f}}_i^c = g_i/T_c^2,$$

where
$Z_i^{AF}$ is the output value of a subtracting unit of the adaptive filter,
$\phi_i^{NCO}$ is the NCO full phase,
$a_i$, $b_i$ and $g_i$ are auxiliary variables,
$\hat{\phi}_i^c$ is the phase estimate of the input signal,
$\hat{f}_i^c$ is the frequency estimate of the input signal,
$\hat{\dot{f}}_i^c$ is the estimate of changing rate of the input signal frequency,
$T_c$ is the control period,
$\alpha_i$, $\beta_i$ and $\gamma_i$ are the transfer coefficients determined by the adaptation block,
wherein, at $\gamma_i = 0$ the filter has the second order, if $\beta_i = 0$ as well, then it will be the first-order adaptive filter.

6. The system of claim 1, wherein the adaptation block analyzes the estimate of the (N−1)-th signal phase derivative at the N-th order adaptive filter input and reduces an order of the adaptive filter by 1 if the estimate of the (N−1)-th signal phase derivative is less than 5 mean square deviations of the estimate of the derivative.

7. The system of claim 1, wherein the adaptation block increases an order of the adaptive filter order when an output value of a subtracting unit of the adaptive filter exceeds a preset threshold and if a current order of the adaptive filter is less than the maximum preset order of the adaptive filter.

8. The system of claim 1, wherein the adaptation block controls a bandwidth of the adaptive filter by changing transfer coefficients of the adaptive filter and calculating a parameter $k_{min} \leq k_i \leq k_{max}$ used to calculate the transfer coefficients of the adaptive filter based on equations:

in a first-order adaptive filter $k_{min} = 1$ $$\alpha_i = 1/k_i,$$

in a second-order adaptive filter $k_{min} = 2$ $$\left. \begin{array}{l} \alpha_i = \dfrac{6}{(k_i+1)} - \dfrac{2}{k_i} \\ \beta_i = \dfrac{6}{k_i(k_i+1)} \end{array} \right\},$$

in a third-order adaptive filter $k_{min} = 3$ $$\left. \begin{array}{l} \alpha_i = (9 \cdot k_i^2 - 9 \cdot k_i + 6)/D \\ \beta_i = (36 \cdot k_i - 18)/D \\ \gamma_i = 60/D \end{array} \right\}$$

here $D = k_i^3 + 3 \cdot k_i^2 + 2 \cdot k_i$.

9. The system of claim 8, wherein a bandwidth of the adaptive filter is approximately equal to a bandwidth of the PLL, and the adaptation block narrows a bandwidth of the adaptive filter according to $k_i = k_{i-1} + \Delta_k$, where $\Delta_k > 0$, if a tracking error is below a predetermined threshold.

10. The system of claim 8, wherein the adaptation block expands a bandwidth of the adaptive filter according to $k_i = k_{i-1}/r$, where $r > 1$, if a tracking error exceeds a predetermined threshold and if a current order of the adaptive filter is equal to the maximum preset order, but if $k_i < k_{min}$ then $k_i = k_{min}$.

11. The system of claim 8, wherein the adaptation block changes an order of the adaptive filter such that the transfer coefficients change but a bandwidth of the adaptive filter is substantially unchanged.

12. A system for estimating non-energy parameters of an input signal, the system comprising:
- a digital phase locked loop (PLL) that tracks the input signal and includes a phase discriminator, a digital loop filter and a digital numerically controlled oscillator (NCO);
- a NCO full phase calculating block receiving an input from the digital loop filter, and outputting a signal corresponding to a full phase of the NCO; and
- an adaptive filter containing an adaptation block filters a signal from the NCO full phase calculating block and estimates any of phase, frequency, changing rate of frequency, and higher derivatives of the phase of the received signal;
- the adaptation block that controls a bandwidth of the adaptive filter by changing transfer coefficients of the adaptive filter and calculating a parameter k that is used to calculate the transfer coefficients of the adaptive filter, such that $k_{min} \leq k_i \leq k_{max}$;
- wherein, in order to reduce fluctuation errors of the estimated non-energy signal parameters, the adaptation block operates at $k_1=k_s$, at which a bandwidth of the adaptive filter is approximately equal to a bandwidth of the PLL, and narrows a filter bandwidth according to $k_i=k_{i-1}+\Delta_k$, where $\Delta_k>0$, if a tracking error is below a predetermined threshold;
- the adaptation block, in order to reduce dynamic errors of the estimated non-energy parameters of the input signal, expands the adaptive filter bandwidth according to $k_i=k_{i-1}/r$, where $r>1$, if the tracking error exceeds the predetermined threshold and a current order of the adaptive filter is equal to a maximum preset order of the filter, but if $k_i<k_{min}$ then $k_i=k_{min}$.

13. The system of claim 12, wherein the NCO full phase calculating block receives digital frequency samples $f_i^{LF}$ from an output of the digital loop filter of the PLL, and the NCO is frequency-controlled, and wherein the NCO operates based on equation:

$$\phi_i^{NCO}=\phi_{i-1}^{NCO}+f_{i-1}^{LF}\cdot\Delta_f^{NCO}\cdot T_c \text{ [cycles]},$$

where $\Delta_f^{NCO}$ is a frequency step size in the NCO, $T_c$—a control period.

14. The system of claim 12, wherein the NCO full phase calculating unit receives digital samples of frequency $f_i^{LF}$ and phase $\phi_i^{LF}$ from an output of the digital loop filter of the PLL, and the NCO is phase-controlled and frequency-controlled, and wherein the NCO full phase calculating block operates based on equation:

$$\phi_i^{NCO}=\phi_{i-1}^{NCO}+\phi_i^{LF}\cdot\Delta_\phi^{NCO}+f_{i-1}^{LF}\cdot\Delta_f^{NCO}\cdot T_c \text{ [cycles]},$$

where $\Delta_\phi^{NCO}$ is a phase step size in the NCO.

15. The system of claim 12, wherein the adaptive filter has the third order (N=3) and is described by the following equations:

$$z_i^{AF}=\phi_i^z-(a_{i-1}+b_{i-1}+0.5\cdot T_c\cdot g_{i-1})$$

$$a_i=a_{i-1}+b_{i-1}+0.5\cdot g_{i-1}+\alpha_i\cdot z_i^{AF},$$

$$b_i=b_{i-1}+g_{i-1}+\beta_i\cdot z_i^{AF},$$

$$g_i=g_{i-1}+\gamma_i\cdot z_i^{AF},$$

$$\hat{\phi}_i^c=a_i+b_i/(2\cdot T_c)+g_i/(12\cdot T_c^2)$$

$$\hat{f}_i^c=b_i/T_c+g_i/(2\cdot T_c^2),$$

$$\hat{\dot{f}}_i^c=g_i/T_c^2,$$

where
- $z_i^{AF}$ is the output value of a subtracting unit of the adaptive filter,
- $\phi_i^{NCO}$ is the NCO full phase,
- $a_i$, $b_i$ and $g_i$ are auxiliary variables,
- $\hat{\phi}_i^c$ is the phase estimate of the input signal,
- $\hat{f}_i^c$ is the frequency estimate of the input signal,
- $\hat{\dot{f}}_i^c$ is the estimate of changing rate of the input signal frequency,
- $T_c$ is the control period,
- $\alpha_i$, $\beta_i$ and $\gamma_i$ are the transfer coefficients determined by the adaptation block,
- wherein, at $\gamma_i=0$ the filter has the second order, if $\beta_i=0$ as well, then it will be the first-order adaptive filter.

16. The system of claim 12, wherein the adaptation block analyzes the estimate of the (N−1)-th signal phase derivative at the N-th order adaptive filter input and reduces an order of the adaptive filter by 1 if the estimate of the (N−1)-th signal phase derivative is less than 5 mean square deviations of the estimate of the derivative.

17. The system of claim 12, wherein the adaptation block increases an order of the adaptive filter order when an output value of a subtracting unit of the adaptive filter exceeds a preset threshold and a current order of the adaptive filter is less than the maximum preset order of the adaptive filter.

18. The system of claim 12, wherein the adaptation block controls a bandwidth of the adaptive filter by changing transfer coefficients of the adaptive filter and calculating a parameter $k_{min} \leq k_i \leq k_{max}$ used to calculate the transfer coefficients of the adaptive filter based on equations:

in a first-order adaptive filter $k_{min}=1$ $$\alpha_i=1/k_i,$$

in a second-order adaptive filter $k_{min}=2$ $$\left.\begin{array}{l}\alpha_i = \dfrac{6}{(k_i+1)} - \dfrac{2}{k_i} \\ \beta_i = \dfrac{6}{k_i(k_i+1)}\end{array}\right\},$$

in a third-order adaptive filter $k_{min}=3$ $$\left.\begin{array}{l}\alpha_i = (9\cdot k_i^2 - 9\cdot k_i + 6)/D \\ \beta_i = (36\cdot k_i - 18)/D \\ \gamma_i = 60/D\end{array}\right\}$$

where $D=k_i^3+3\cdot k_i^2+2\cdot k_i$.

19. The system of claim 18, wherein the adaptation block changes an order of the adaptive filter such that the transfer coefficients change but a bandwidth of the adaptive filter is substantially unchanged.

* * * * *